United States Patent [19]
Tzu et al.

[11] Patent Number: 5,973,407
[45] Date of Patent: Oct. 26, 1999

[54] INTEGRAL HEAT SPREADER FOR SEMICONDUCTOR PACKAGE

[75] Inventors: Chung-Hsing Tzu, Taipie Hsien; Jung-Yu Lee, Hsin Chu Hsien, both of Taiwan

[73] Assignee: Sampo Semiconductor Corporation, Tao Yuan, Taiwan

[21] Appl. No.: 09/120,794

[22] Filed: Jul. 23, 1998

[51] Int. Cl.[6] .................................................. H01L 23/28
[52] U.S. Cl. ...................... 257/796; 257/675; 257/706; 257/707; 257/720
[58] Field of Search .................................... 257/796, 717, 257/718, 720, 706, 666, 675, 707

[56] References Cited

U.S. PATENT DOCUMENTS 5,367,196 11/1994 Mahulika et al. ....................... 257/787
5,859,471 1/1999 Kuraishi et al. ........................ 257/666

FOREIGN PATENT DOCUMENTS

| 4-94153 | 3/1992 | Japan . |
| 6-85110 | 3/1994 | Japan . |
| 6-97326 | 4/1994 | Japan . |

*Primary Examiner*—Tom Thomas
*Assistant Examiner*—Luan Thai
*Attorney, Agent, or Firm*—Rosenberg, Klein & Bilker

[57] ABSTRACT

The present invention disclose an Integral heat spreader for semiconductor package which is a metal plate and characterized in that a plurality of upper bumps are provided on the top surface of the metal plate. By the provision of the upper bumps, one or more space(s) can be formed between the bottom surface of the paddle and the top surface of the heat spreader for the compact filling of molding compound. Therefore, the occurrence of gap or delamination can be prevented, while maintaining the necessary effect of heat dissipation.

2 Claims, 6 Drawing Sheets

INTEGRAL HEAT SPREADER FOR SEMICONDUCTOR PACKAGE

FIELD OF THE INVENTION

The present invention relates to an integral heat spreader for semiconductor package, more particularly, to an integral heat spreader for semiconductor package by which the delamination problem of package can be prevented while necessary effect of heat dissipation can be preserved.

BACKGROUND OF THE PRESENT INVENTION

In recent years, packaging becomes the performance-limiting factor for microelectronic device, and the issues such as size, weight, cost, pin count, and power consumption are important for packaging design. More particularly, the concern of heat dissipation becomes more important when the power and operation frequency of electronic systems increase.

The nowadays heat-dissipation means for semiconductor package can be classified to following three types:
(1) Heat sink is generally metal plate set arranged externally to the package of the semiconductor.
(2) Heat spreader is metal plate encapsulated within the package and functions to convey the thermal energy from chip to environment.
(3) Heat slug is also arranged within the package but portion thereof exposes to outside.

In above-mentioned heat-dissipation means for semiconductor package, the heat spreader and heat slug have more profound effect on the semiconductor package because they are entirely or largely placed within the molding compound of the package. As to heat slug, gap is liable to form on the junction of molding compound and heat slug, because the slug has partial portion exposing outside. The moisture might be entrapped from the gap and accumulated within the package. The semiconductor package has the risk of cracking (popcorning) when subjected to a following soldering process due to the thermal expansion of moisture.

As to the heat spreaders, they do not suffer to the problem mentioned above because they are entirely enclosed within the package. However, when the heat spreader is arranged below the paddle, gap is liable to form between the paddle and the heat spreader because the heat spreader is thin and hard to attach to the paddle closely. The gap is also tends to accumulate moisture and induce the problem of popcorning.

FIG. 1, FIG. 2A, FIG. 2B show the perspective view, top view and cross section view of a conventional heat spreader, respectively. As can be seen from those figures, the conventional heat spreader is generally a metal plate 10 having a plurality of lower bumps 12 and a plurality of through holes 14, wherein the through holes 14 are provided to facilitate the filling of the molding compound. FIG. 3 shows the arrangement of the aforementioned heat spreader within a semiconductor package. As can be seen from this figure, the chip 15 is bonded to the paddle 16 by viscous adhesives (not shown) such as silver epoxy. Then the heat spreader 10 is attached below the paddle 16 and the resulting structure is encapsulated with a molding compound 17 to complete the package. However, because the heat spreader 10 and the paddle 16 are generally thin-sheet form, they are hard to attach closely. Therefore, gap or delamination is liable to entrap moisture. The semiconductor package has the risk of popcorning when subjected to a following soldering process due to the thermal expansion of moisture.

SUMMARY OF THE INVENTION

The object of the present invention is to provide an Integral heat spreader for semiconductor package by which the delamination problem between die paddle and heat spreader of package can be prevented while necessary effect of heat dissipation can be preserved.

To achieve the object the present invention provides an integral heat spreader for semiconductor package which is a metal plate and characterized in that a plurality of upper bumps are provided on the top surface of the metal plate. By the provision of the upper bumps, one or more space(s) can be formed between the paddle and the heat spreader. Therefore, the molding compound can be filled compactly and the occurrence of gap or delamination can be prevented.

The various objects and advantages of the present invention will be more readily understood from the following detailed description when read in conjunction with the appended drawings, in which:

Figure 1:
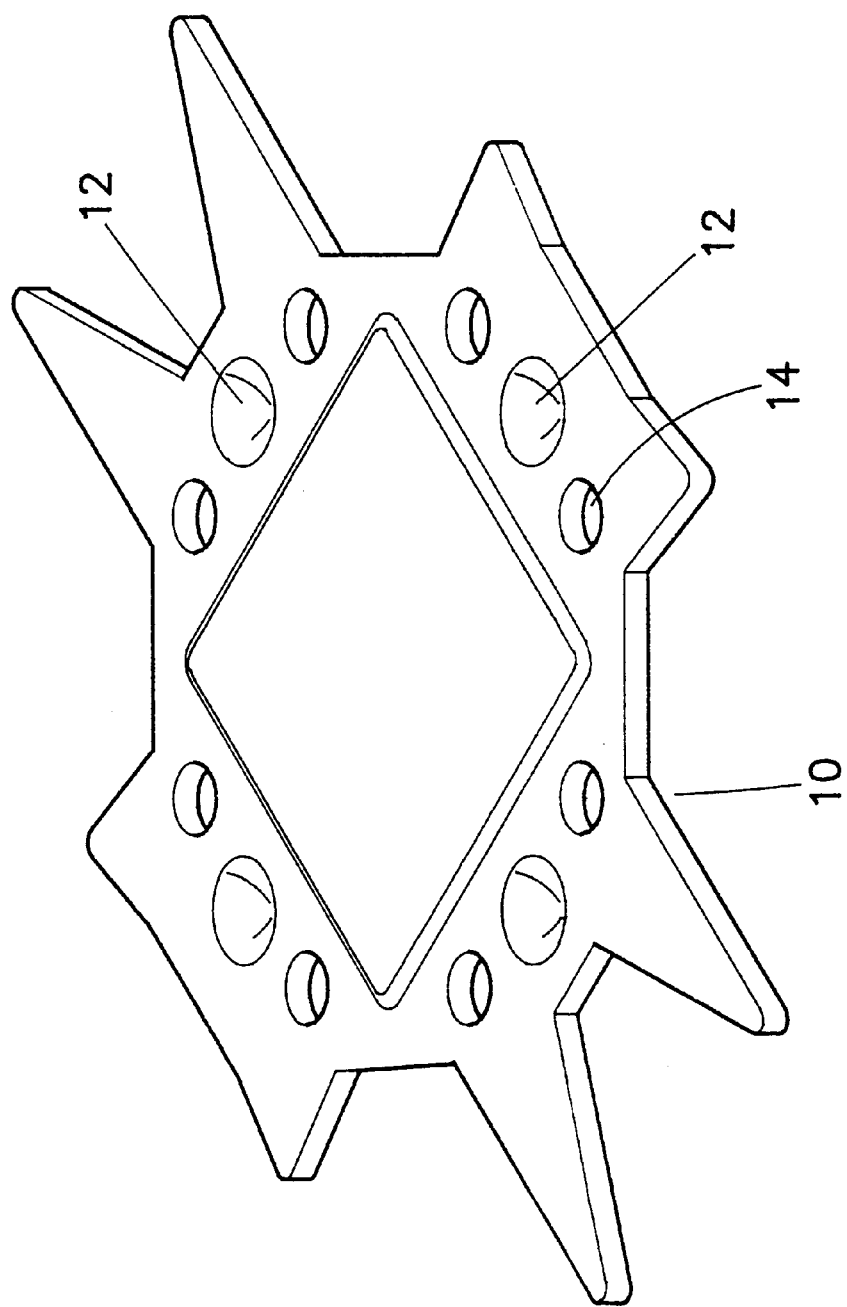
FIG. 1 shows the perspective view of a conventional heat spreader.
Figure 2B:
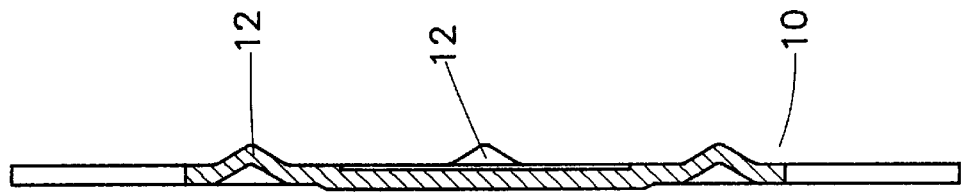
FIG. 2B shows the cross section view of the conventional heat spreader in FIG. 1.
Figure 2A:
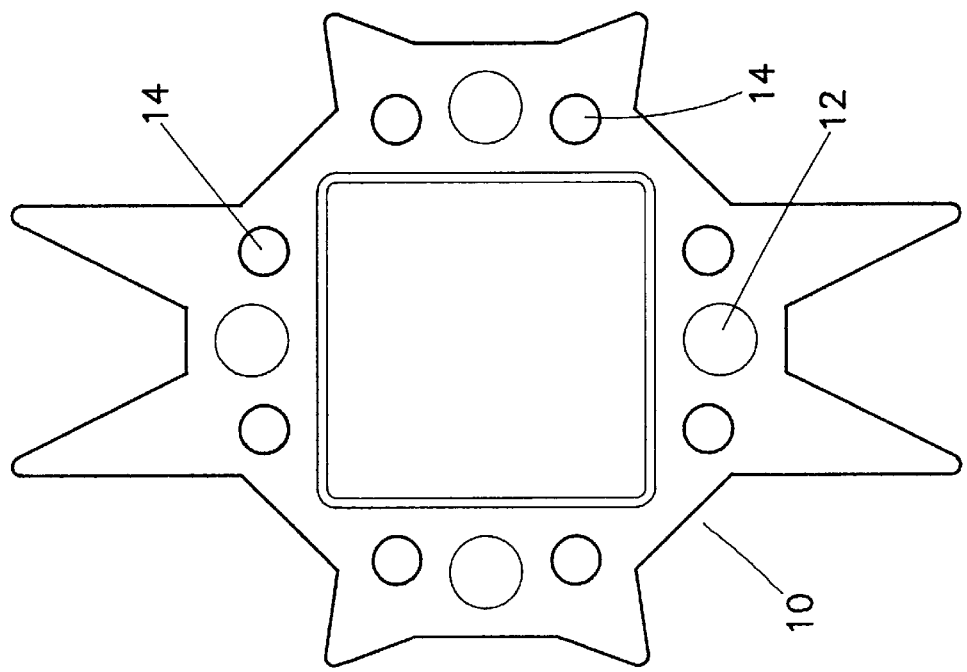
FIG. 2A shows the top view of the conventional heat spreader in FIG. 1.
Figure 3:
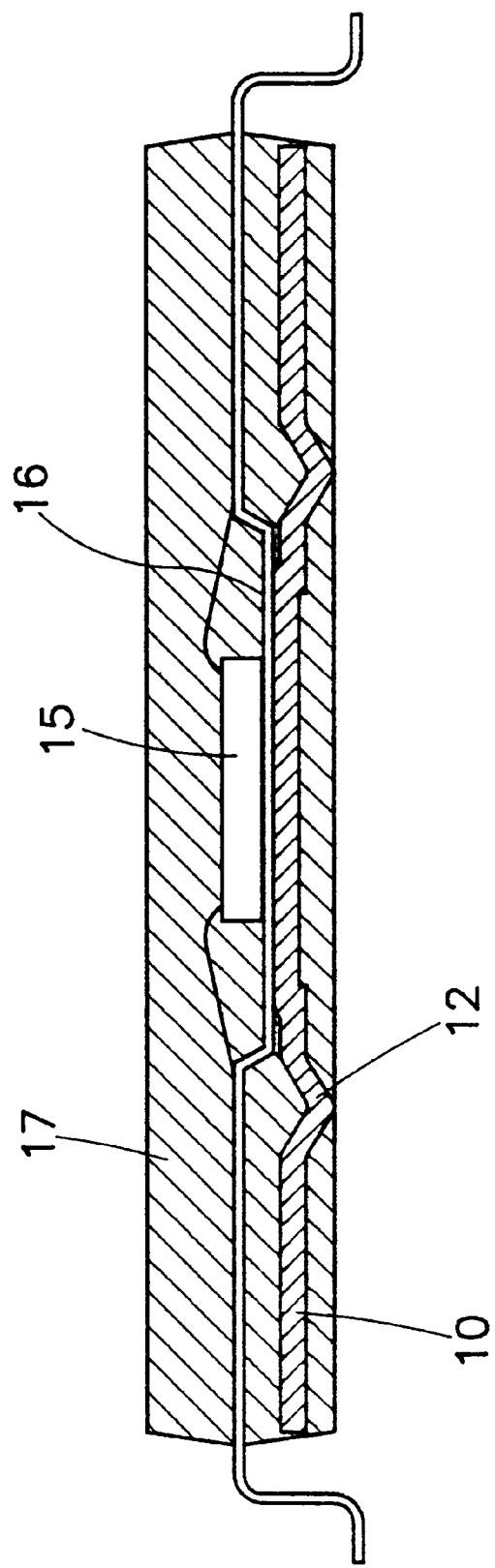
FIG. 3 shows the arrangement of the heat spreader in FIG. 1 within a semiconductor package.

NUMERAL 10 heat spreader
11 upper bump
12 lower bump
14 through hole
15 chip
16 paddle
17 molding compound

DETAILED DESCRIPTION OF THE PREFERRED EMBODIMENT

Generally, when a leadframe equipped with a heat spreader is encapsulated with molding compound, gap or delamination is liable to form between the paddle and the heat spreader where the molding compound is hard to fill in. The gap or delamination is liable to entrap moisture. The semiconductor package has the risk of popcorning when subjected to a following soldering process due to the thermal expansion of moisture. The heat spreader according to the present invention is aimed to solve the above problem by providing space(s) between the paddle and the heat spreader for the compact filling of molding compound, thus preventing the occurrence of gap or delamination.

Figure 4:
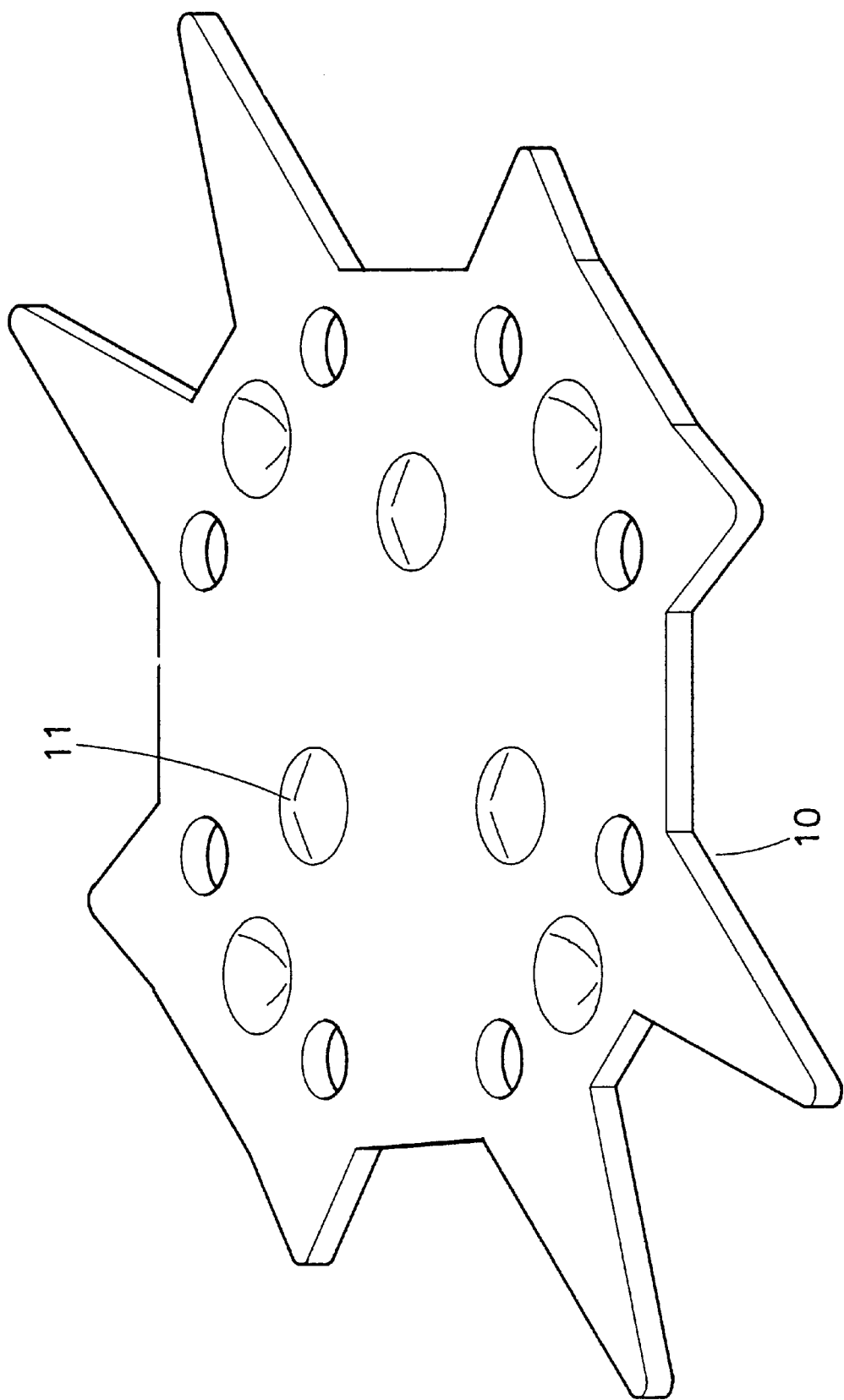
FIG. 4 shows the perspective view of the heat spreader according to the preferred embodiment of the present invention.
Figure 5:
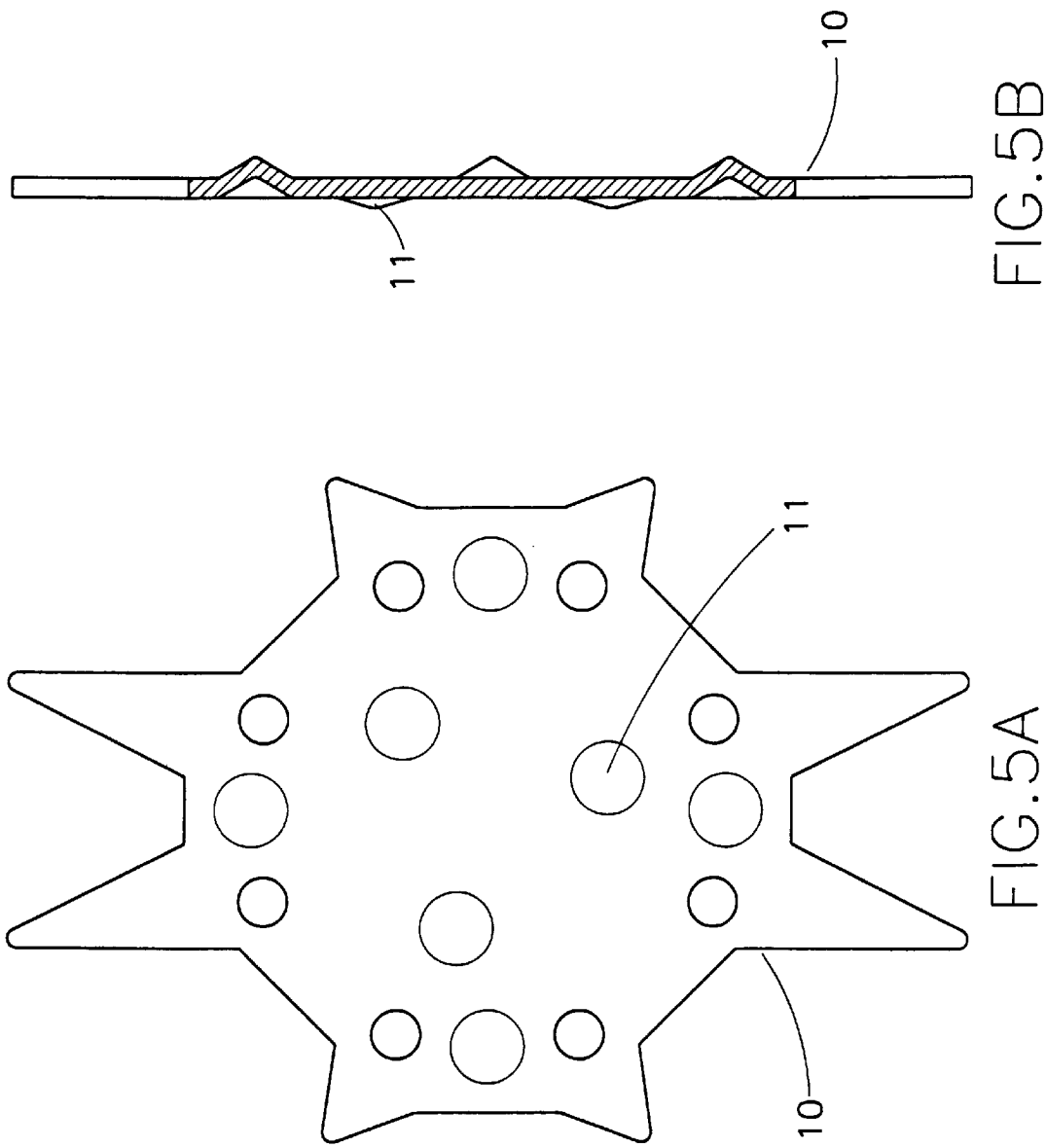
FIG. 5A shows the top view of the heat spreader according to the preferred embodiment of the present invention.
FIG. 5B shows the cross section view of the heat spreader according to the preferred embodiment of the present invention.
Figure 6:
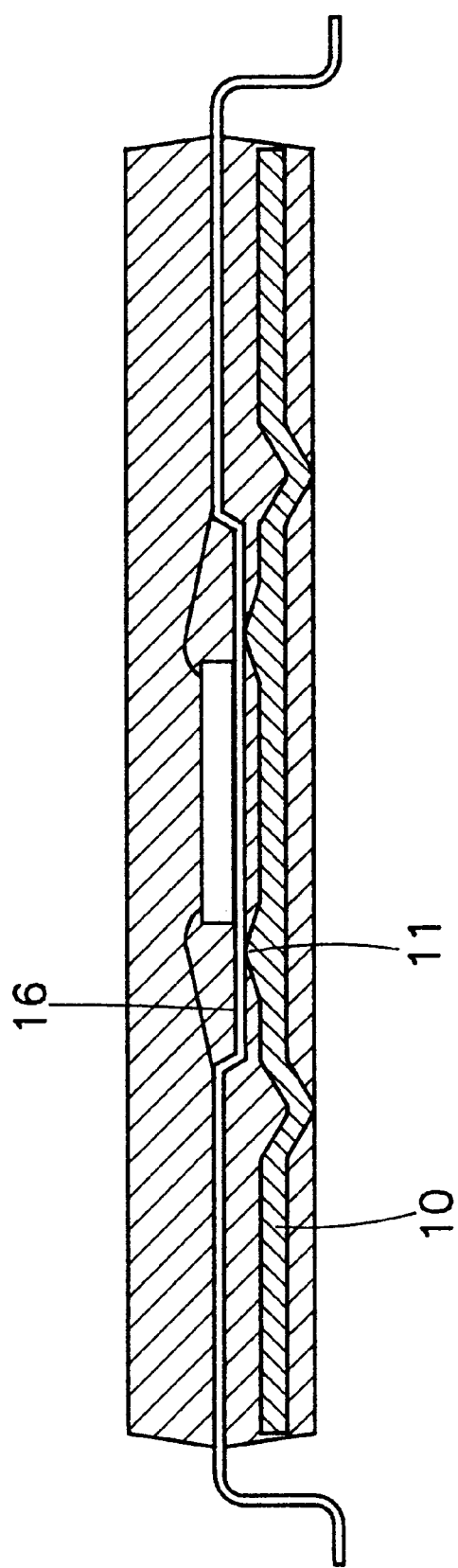
FIG. 6 shows the arrangement of the heat spreader according to the preferred embodiment of the present invention within a semiconductor package.

FIG. 4, FIG. 5A and FIG. 5B show the perspective view, the top view, the cross section view of the heat spreader according to the preferred embodiment of the present invention, respectively. As shown in those figures, the heat spreader 10 according to the present invention is characterized in that a plurality of upper bumps 11 are provided on the top surface thereof. By the provision of the upper bumps 11, one or more space(s) can be formed between the bottom surface of the paddle 16 and the top surface of the heat spreader 10 for the compact filling of molding compound. Therefore, the occurrence of gap or delamination can be prevented.

Fig, 6 shows the arrangement of the heat spreader according to the preferred embodiment of the present invention within a semiconductor package. As can be best from this figure, when the semiconductor chip 15 is subjected to a package process, the upper bumps 11 of the heat spreader 10 according to the present invention provide space(s) between the bottom surface of the paddle and the top surface of the heat spreader. The space(s) provided by the upper bumps 11 could enhance the compact filling of molding compound. Therefore, the occurrence of gap or delamination can be prevented.

Moreover, the thermal energy generated by the chip 15 can be conveyed to the heat spreader 10 through the upper bumps 11, thus maintaining the necessary effect of heat dissipation.

To sum up, the integral heat spreader according to the present invention can prevent the formation of gap or delamination within the package while maintaining the necessary effect of heat dissipation. Therefore, it is advantageous in practical aspect.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

We claim:

1. An integral heat spreader for a semiconductor package, comprising:

a paddle member having an upper and lower surface, said upper surface in contact with a semiconductor chip; and, a thermally conductive metal plate for dissipating heat from said semiconductor package, said thermally conductive metal plate having a substantially planar configuration defining an upper plate surface and a lower plate surface, said thermally conductive metal plate having a plurality of projecting bumps formed integrally with said metal plate and extending from said upper plate surface for contacting said lower surface of said paddle and an apex portion thereof, each of said bumps having a rounded apex portion for minimizing a contact area between said bump and said paddle lower surface whereby a gap formation between said bump apex portion and said paddle is minimized.

2. The integral heat spreader for semiconductor package as recited in claim 1, wherein said metal plate is formed of aluminum.

* * * * *